United States Patent
Jordan et al.

(10) Patent No.: US 11,476,685 B2
(45) Date of Patent: Oct. 18, 2022

(54) SYSTEM AND METHOD FOR DETECTING BATTERY FAULTS IN A PITCH SYSTEM OF A WIND TURBINE

(71) Applicant: General Electric Company, Schenectady, NY (US)

(72) Inventors: Christopher Albert Jordan, Charlton, NY (US); Michael James Rizzo, Glenville, NY (US); John Joseph Mihok, Schenectady, NY (US); Frank William Ripple, Jr., Broadalbin, NY (US); Kyle Raymond Barden, Troy, NY (US)

(73) Assignee: General Electric Company, Schenectady, NY (US)

( * ) Notice: Subject to any disclaimer, the term of this patent is extended or adjusted under 35 U.S.C. 154(b) by 494 days.

(21) Appl. No.: 16/564,267

(22) Filed: Sep. 9, 2019

(65) Prior Publication Data
US 2021/0075232 A1 Mar. 11, 2021

(51) Int. Cl.
*G01R 31/392* (2019.01)
*G01R 19/165* (2006.01)
*G01R 31/52* (2020.01)
*H02J 7/00* (2006.01)
*F03D 17/00* (2016.01)
*F03D 7/02* (2006.01)

(52) U.S. Cl.
CPC .......... *H02J 7/0029* (2013.01); *F03D 7/0224* (2013.01); *F03D 17/00* (2016.05); *G01R 31/392* (2019.01); *G01R 19/16542* (2013.01); *G01R 19/16576* (2013.01); *G01R 31/52* (2020.01)

(58) Field of Classification Search
CPC ...... H02J 7/0029; F03D 7/0224; F03D 17/00; G01R 31/392; G01R 19/16542; G01R 19/16576; G01R 31/52; G01R 31/371; G01R 31/3835; Y02E 10/72
See application file for complete search history.

(56) References Cited

U.S. PATENT DOCUMENTS 6,204,645 B1 3/2001 Cullen
7,560,907 B2 7/2009 Nelson
(Continued)

FOREIGN PATENT DOCUMENTS

CN 202004444 U 10/2011
CN 106602626 A 4/2017
(Continued)

OTHER PUBLICATIONS

European Search Report for EP Application No. 20195329,6, dated Feb. 18, 2021.

*Primary Examiner* — Stacy Whitmore
(74) *Attorney, Agent, or Firm* — Dority & Manning, P.A.

(57) ABSTRACT

A method for detecting a fault in a direct current (DC) battery of a pitch system includes receiving, via a server, a plurality of voltage signals of the battery over at least one time period. The method also includes storing, via a database of the server, the plurality of voltage signals of the battery for the predetermined time period. Further, the method includes determining, via the server, a state of the battery as a function of the plurality of voltage signals. When the state of the battery is indicative of a battery fault, the method includes implementing a corrective action for the battery.

14 Claims, 5 Drawing Sheets

(56) References Cited

U.S. PATENT DOCUMENTS

| | | | |
|---|---|---|---|
| 8,476,870 B2 | 7/2013 | Labrunie et al. | |
| 2006/0017581 A1* | 1/2006 | Schwendinger | G01R 31/371 |
| | | | 340/691.3 |
| 2010/0135801 A1* | 6/2010 | Melius | F03D 7/0224 |
| | | | 73/862.192 |
| 2014/0244225 A1* | 8/2014 | Balasingam | G06F 30/367 |
| | | | 703/2 |
| 2017/0272260 A1 | 9/2017 | Han et al. | |
| 2019/0176639 A1 | 6/2019 | Kumar et al. | |

FOREIGN PATENT DOCUMENTS

| | | | | |
|---|---|---|---|---|
| CN | 108132441 A | 12/2017 | | |
| CN | 108590985 A | 9/2018 | | |
| EP | 0 977 047 A2 | 2/2000 | | |
| EP | 1 152 624 A1 | 11/2001 | | |
| EP | 2 778 697 A1 | 9/2014 | | |
| EP | 2313792 B1 * | 4/2017 | ........... | F03D 7/0224 |
| EP | 3 406 893 A1 | 11/2018 | | |
| JP | 2009 255742 A | 11/2009 | | |
| JP | 2015 163043 A | 9/2015 | | |
| KR | 20160122519 A * | 10/2016 | ............. | Y02E 10/72 |
| WO | WO 2005/117232 A2 | 12/2005 | | |
| WO | WO2008/152238 A2 | 12/2008 | | |
| WO | WO 2018/083873 A1 | 5/2018 | | |

\* cited by examiner

SYSTEM AND METHOD FOR DETECTING BATTERY FAULTS IN A PITCH SYSTEM OF A WIND TURBINE

FIELD

The present disclosure relates generally to wind turbines, and more particularly to systems and methods for detecting battery faults in a pitch system of a wind turbine.

BACKGROUND

Wind power is considered one of the cleanest, most environmentally friendly energy sources presently available, and wind turbines have gained increased attention in this regard. A modern wind turbine typically includes a tower, a generator, a gearbox, a nacelle, and a rotor including one or more rotor blades. The rotor blades capture kinetic energy from wind using known foil principles and transmit the kinetic energy through rotational energy to turn a shaft coupling the rotor blades to a gearbox, or if a gearbox is not used, directly to the generator. The generator then converts the mechanical energy to electrical energy that may be deployed to a utility grid.

During operation, the direction of the wind which powers the wind turbine may change. The wind turbine may thus adjust the nacelle through, for example, a yaw adjustment about a longitudinal axis of the tower to maintain alignment with the wind direction. In addition, the wind turbine may adjust a pitch angle of one or more of the rotor blades via a pitch drive mechanism configured with a pitch bearing to change the angle of the blades with respect to the wind.

Typical pitch drive mechanisms include pitch drive motor, a pitch drive gearbox, and a pitch drive pinion. In such configurations, the pitch drive motor is coupled to the pitch drive gearbox so that the pitch drive motor imparts mechanical force to the pitch drive gearbox. Similarly, the pitch drive gearbox may be coupled to the pitch drive pinion for rotation therewith. The pitch drive pinion may, in turn, be in rotational engagement with the pitch bearing coupled between the hub and a corresponding rotor blade such that rotation of the pitch drive pinion causes rotation of the pitch bearing. Thus, in such embodiments, rotation of the pitch drive motor drives the pitch drive gearbox and the pitch drive pinion, thereby rotating the pitch bearing and the rotor blade about the pitch axis.

During normal operation, the pitch drive motors are driven by the power grid. However, in some instances, such as during an adverse grid event, the pitch drive motors may be driven by one or more backup batteries. If pitching of the blades relies on such batteries (i.e. due to a grid loss), it is important to ensure that the batteries are capable of operating when needed. Overtime, however, the motor batteries of the pitch drive mechanisms lose their charge and eventually die. Thus, if such batteries die without notice, the rotor blade associated with the dead batteries may become stuck since there is no power available to pitch the blade. In such instances, loads may increase on the stuck rotor blade, thereby causing damage thereto.

Accordingly, the present disclosure is directed to systems and methods for detecting battery faults in a pitch system of a wind turbine so as to address the aforementioned issues.

BRIEF DESCRIPTION

Aspects and advantages of the invention will be set forth in part in the following description, or may be obvious from the description, or may be learned through practice of the invention.

In one aspect, the present disclosure is directed to a method for detecting a fault in a direct current (DC) battery. The method includes receiving, via a server, a plurality of voltage signals of the battery over at least one time period. The method also includes storing, via a database of the server, the plurality of voltage signals of the battery for the predetermined time period. Further, the method includes determining, via the server, a state of the battery as a function of the plurality of voltage signals. The method also includes implementing a corrective action for the battery when the state of the battery is indicative of a battery fault.

In an embodiment, the voltage signals may include one or more minimum voltage values, one or more maximum voltage values, and/or one or more standard deviation values of the battery voltage. In another embodiment, the method may include filtering, via at least one filter, the plurality of voltage signals of the battery.

In further embodiments, determining the state of the battery as a function of the plurality of voltage signals may include comparing the one or more minimum voltage values to a minimum voltage threshold of the battery and when the one or more minimum voltage values are below the minimum voltage threshold of the battery, identifying a voltage drop of the battery.

In additional embodiments, determining the state of the battery as a function of the plurality of voltage signals may include, when the one or more minimum voltage values is below the minimum voltage threshold of the battery, determining, via a controller communicatively coupled to the server, one or more standard deviation values of the plurality of voltage signals of the battery and comparing the one or more standard deviation values of the plurality of voltage signals to a predefined threshold to ensure that the voltage drop of the battery is sustained for a predetermined time period.

In an embodiment, the method may be implemented over multiple time periods. For example, the plurality of time periods may include 10-minute data aggregation intervals.

In several embodiments, the method may include monitoring, via at least one sensor, the plurality of voltage signals of the battery. In another embodiment, the battery may be a part of a pitch system of a wind turbine.

In particular embodiments, the time period(s) may occur when the battery is used to power a pitch motor of the pitch system.

In yet another embodiment, implementing the corrective action may include generating an alarm signal, scheduling a maintenance action for the battery, or replacing the battery. For example, in an embodiment, the method may include replacing the battery when multiple battery faults are detected in the battery.

In another aspect, the present disclosure is directed to a system for detecting a fault in a battery of a pitch system of a wind turbine. The system includes at least one sensor configured for monitoring a plurality of voltage signals of the battery over at least one time period and a server communicatively coupled to the sensor(s). The server is configured to perform a plurality of operations, including but not limited to determining a state of the battery as a function of the plurality of voltage signals and implementing a corrective action for the battery when the state of the battery is indicative of a battery fault.

It should also be understood that the system may further include any of the additional features as described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
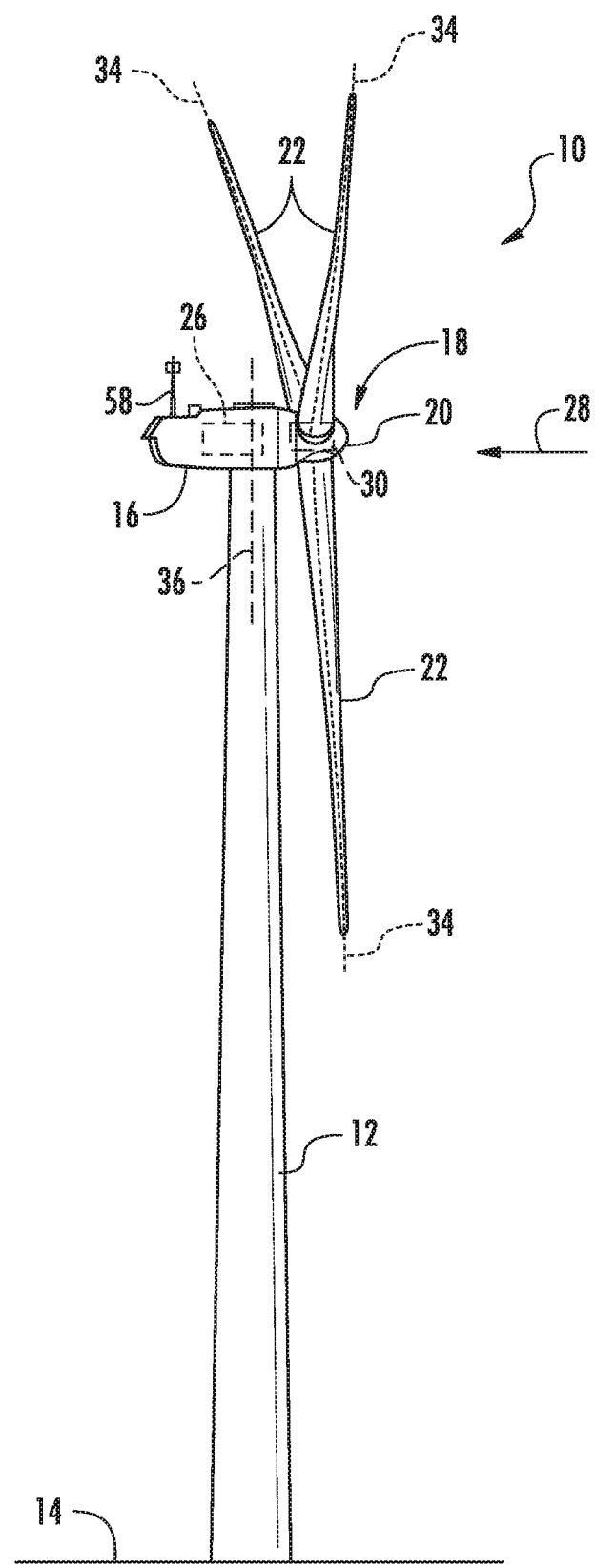
FIG. 1 illustrates a perspective view of a wind turbine according to one embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present disclosure is directed to systems and methods for detecting battery faults in a pitch system of a wind turbine. More specifically, in an embodiment, the systems and methods of the present disclosure are configured to leverage the combination of standard deviation of battery voltage, maximum voltage measurements, and/or minimum voltage measurements to detect battery failure. The systems and methods of the present disclosure may also incorporate using multiple time samples to ensure a battery is actually failing. Determining a failing battery with just one of these measurements aggregated in 10-minute increments, for example, can be challenging. For example, if only the minimum voltage is used, the algorithm may have false positives due to in-rush current (momentary drop in voltage that occurs on all batteries). Further, if only the standard deviation is used, the algorithm may also have false positives due to regeneration current (voltage spike in the positive direction). Accordingly, systems and methods of the present disclosure use the minimum voltage to determine that a battery voltage is below normal and the standard deviation to detect that the drop was a sustained drop. Furthermore, the systems and methods of the present disclosure may also evaluate whether multiple occurrences of the voltage drop have occurred to give accurate failed battery detection.

Thus, the present disclosure provides many advantages, including, for example, automated detection of failing batteries without manual checks by maintenance personnel. As such, site managers have the ability to better plan for wind turbine battery replacement and/or repair. Further, the systems and methods of the present disclosure can utilize existing wind turbine data. Accordingly, the systems and methods of the present disclosure ensure batteries are working properly when needed in an emergency braking procedure.

Referring now to the drawings, FIG. 1 illustrates perspective view of one embodiment of a wind turbine 10 according to the present disclosure. As shown, the wind turbine 10 includes a tower 12 extending from a support surface 14, a nacelle 16 mounted on the tower 12, and a rotor 18 coupled to the nacelle 16. The rotor 18 includes a rotatable hub 20 and at least one rotor blade 22 coupled to and extending outwardly from the hub 20. For example, in the illustrated embodiment, the rotor 18 includes three rotor blades 22. However, in an alternative embodiment, the rotor 18 may include more or less than three rotor blades 22. Each rotor blade 22 may be spaced about the hub 20 to facilitate rotating the rotor 18 to enable kinetic energy to be transferred from the wind into usable mechanical energy, and subsequently, electrical energy. For instance, the hub 20 may be rotatably coupled to an electric generator 24 (FIG. 2) positioned within the nacelle 16 to permit electrical energy to be produced.

Figure 2:
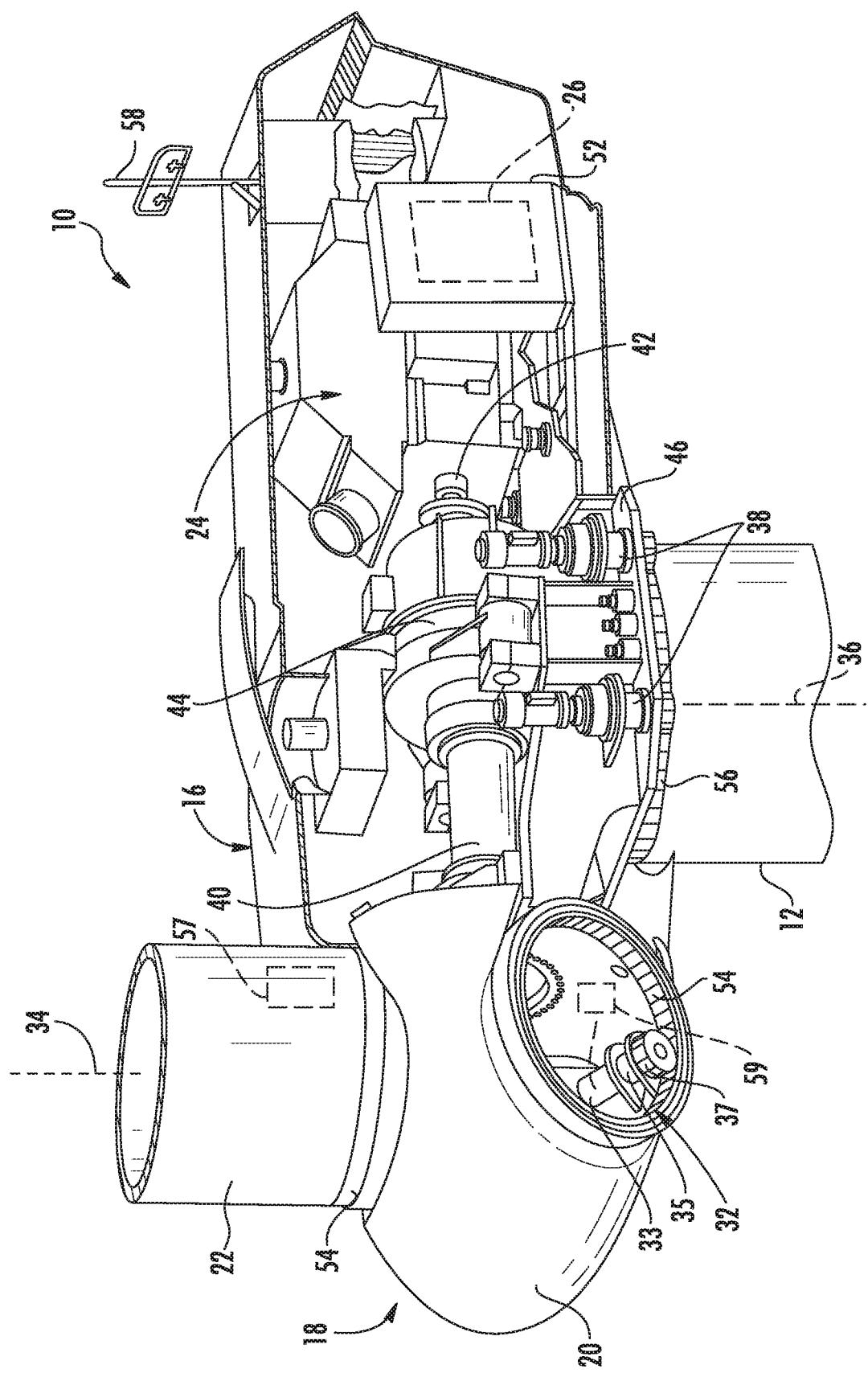
FIG. 2 illustrates a perspective, internal view of a nacelle of a wind turbine according to one embodiment of the present disclosure.

Referring now to FIG. 2, a simplified, internal view of one embodiment of the nacelle 16 of the wind turbine 10 is illustrated. As shown, a generator 24 may be disposed within the nacelle 16. In general, the generator 24 may be coupled to the rotor 18 of the wind turbine 10 for generating electrical power from the rotational energy generated by the rotor 18. For example, the rotor 18 may include a main shaft 40 coupled to the hub 20 for rotation therewith. The generator 24 may then be coupled to the main shaft 40 such that rotation of the main shaft 40 drives the generator 24. For instance, in the illustrated embodiment, the generator 24 includes a generator shaft 42 rotatably coupled to the main shaft 40 through a gearbox 44. However, in other embodiments, it should be appreciated that the generator shaft 42 may be rotatably coupled directly to the main shaft 40. Alternatively, the generator 24 may be directly rotatably coupled to the main shaft 40.

It should be appreciated that the main shaft 40 may generally be supported within the nacelle 16 by a support frame or bedplate 46 positioned atop the wind turbine tower 12. For example, the main shaft 40 may be supported by the bedplate 46 via a pair of pillow blocks 48, 50 mounted to the bedplate 46.

As shown in FIGS. 1 and 2, the wind turbine 10 may also include a turbine control system or a turbine controller 26 within the nacelle 16. For example, as shown in FIG. 2, the turbine controller 26 is disposed within a control cabinet 52 mounted to a portion of the nacelle 16. However, it should be appreciated that the turbine controller 26 may be disposed at any location on or in the wind turbine 10, at any location on the support surface 14 or generally at any other location. The turbine controller 26 may generally be configured to control the various operating modes (e.g., start-up or shut-down sequences) and/or components of the wind turbine 10.

Each rotor blade 22 may also include a pitch adjustment mechanism 32 configured to rotate each rotor blade 22 about its pitch axis 34. Further, each pitch adjustment mechanism 32 may include a pitch drive motor 33 (e.g., any suitable electric, hydraulic, or pneumatic motor), a pitch drive gearbox 35, and a pitch drive pinion 37. In such embodiments, the pitch drive motor 33 may be coupled to the pitch drive gearbox 35 so that the pitch drive motor 33 imparts mechanical force to the pitch drive gearbox 35. Similarly, the pitch drive gearbox 35 may be coupled to the pitch drive pinion 37 for rotation therewith. The pitch drive pinion 37 may, in turn, be in rotational engagement with a pitch bearing 54 coupled between the hub 20 and a corresponding rotor blade 22 such that rotation of the pitch drive pinion 37 causes rotation of the pitch bearing 54. Thus, in such embodiments, rotation of the pitch drive motor 33 drives the pitch drive gearbox 35 and the pitch drive pinion 37, thereby rotating the pitch bearing 54 and the rotor blade 22 about the pitch axis 34. Similarly, the wind turbine 10 may include one or more yaw drive mechanisms 38 communicatively coupled to the controller 26, with each yaw drive mechanism(s) 38 being configured to change the angle of the nacelle 16 relative to the wind (e.g., by engaging a yaw bearing 56 of the wind turbine 10).

Further, the turbine controller 26 may also be communicatively coupled to each pitch adjustment mechanism 32 of the wind turbine 10 (one of which is shown) through a separate or integral pitch controller 30 (FIG. 1) for controlling and/or altering the pitch angle of the rotor blades 22 (i.e., an angle that determines a perspective of the rotor blades 22 with respect to the direction 28 of the wind).

In addition, as shown in FIG. 2, one or more sensors 57, 58, 59 may be provided on the wind turbine 10. More specifically, as shown, a blade sensor 57 may be configured with one or more of the rotor blades 22 to monitor the rotor blades 22. Further, as shown, a wind sensor 58 may be provided on the wind turbine 10. For example, the wind sensor 58 may a wind vane, and anemometer, a LIDAR sensor, or another suitable sensor that measures wind speed and/or direction. In addition, a pitch sensor 59 may be configured with each of the pitch drive mechanism 32, e.g. with one or more batteries of the pitch drive motors 33 thereof, which will be discussed in more detail below. As such, the sensors 57, 58, 59 may further be in communication with the controller 26, and may provide related information to the controller 26. For example, the pitch sensor(s) 59 may correspond to temperature sensors that send temperature signals to the controllers 26, 30 to indicate an actual temperature of the pitch batteries, which is described in more detail herein.

It should also be appreciated that, as used herein, the term "monitor" and variations thereof indicates that the various sensors of the wind turbine 10 may be configured to provide a direct measurement of the parameters being monitored and/or an indirect measurement of such parameters. Thus, the sensors described herein may, for example, be used to generate signals relating to the parameter being monitored, which can then be utilized by the controller 26 to determine the condition.

Figure 3:
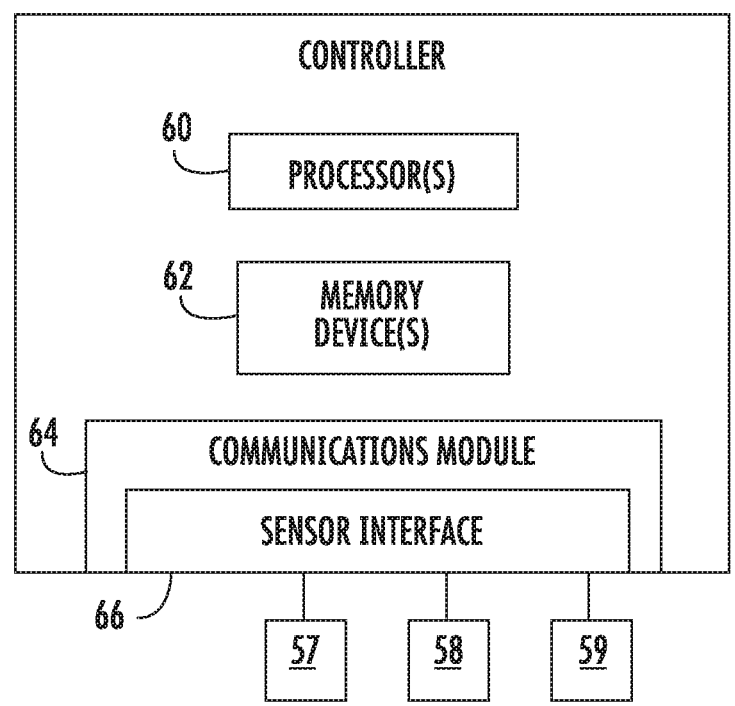
FIG. 3 illustrates a schematic diagram of one embodiment of suitable components that may be included in a wind turbine controller according to the present disclosure.

Referring now to FIG. 3, there is illustrated a block diagram of one embodiment of suitable components that may be included within a controller according to the present disclosure. As used herein, the present disclosure may be implemented with a controller (such as the turbine controller 26 or the pitch controller 30) or with a separate analytics server 76 (FIG. 4) that is communicatively coupled to a controller. As described herein, the analytics server 76 generally encompasses any suitable computer program or device that provides functionalities for other programs or devices. In addition, as shown in FIG. 4, the analytics server 76 may also include at least one database 78 for executing the various functionalities.

As shown in FIG. 3, the controller 26 (or pitch controller 30) may include one or more processor(s) 60 and associated memory device(s) 62 configured to perform a variety of computer-implemented functions (e.g., performing the methods, steps, calculations and the like and storing relevant data as disclosed herein). Additionally, the controller 26 may also include a communications module 64 to facilitate communications between the controller 26 and the various components of the wind turbine 10. Further, the communications module 64 may include a sensor interface 66 (e.g., one or more analog-to-digital converters) to permit signals transmitted from one or more sensors 57, 58, 59 to be converted into signals that can be understood and processed by the processors 60. It should be appreciated that the sensors 57, 58, 59 may be communicatively coupled to the communications module 64 using any suitable means. For example, as shown in FIG. 3, the sensors 57, 58, 59 are coupled to the sensor interface 66 via a wired connection. However, in other embodiments, the sensors 57, 58, 59 may be coupled to the sensor interface 66 via a wireless connection, such as by using any suitable wireless communications protocol known in the art.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 62 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 62 may generally be configured to store suitable computer-readable instructions that, when implemented by the processor(s) 60, configure the controller 26 to perform various functions including, but not limited to, transmitting suitable control signals to implement corrective action(s) in response to a distance signal exceeding a predetermined threshold as described herein, as well as various other suitable computer-implemented functions.

Figure 4:
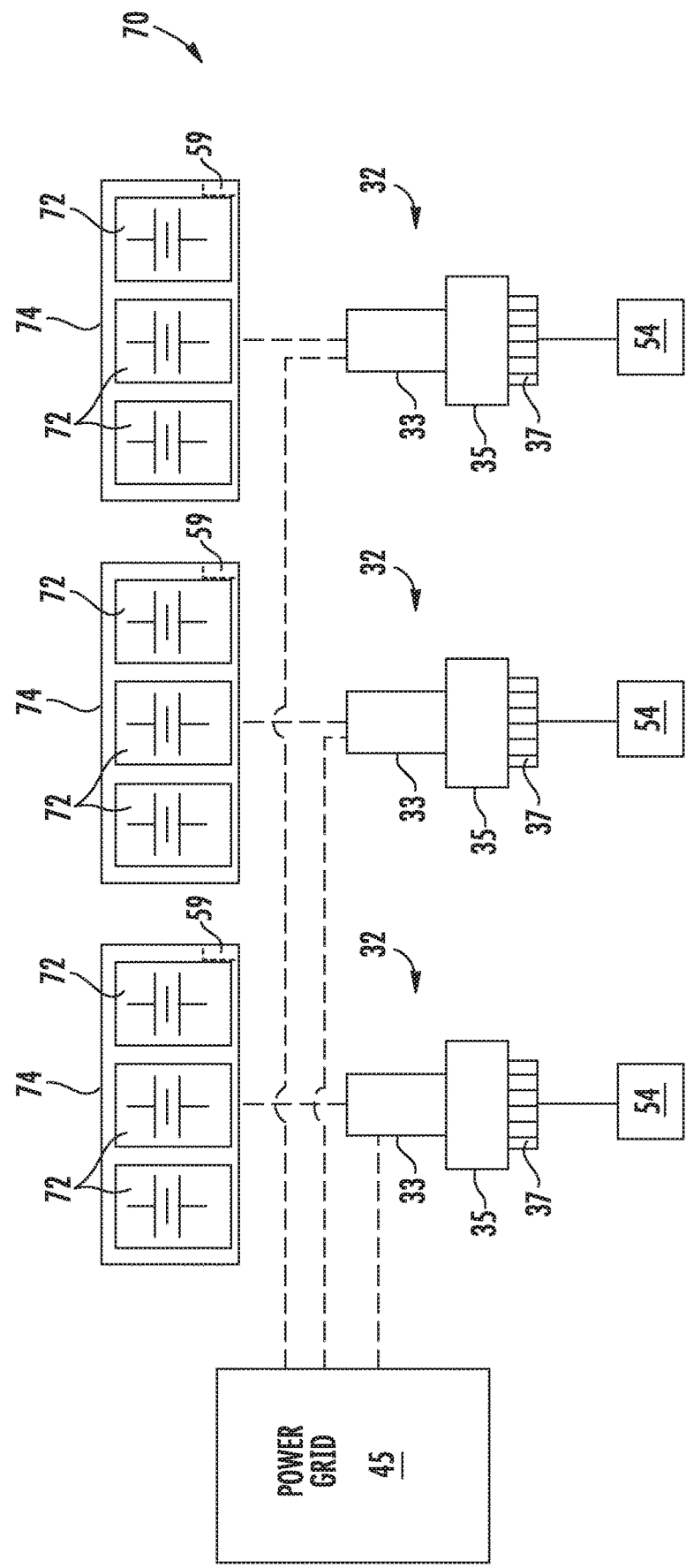
FIG. 4 illustrates a schematic diagram of one embodiment of a pitch system of a wind turbine according to the present disclosure.

Referring now to FIG. 4, a schematic diagram of one embodiment an overall pitch system 70 for the wind turbine 10 is illustrated. More specifically, as shown, the pitch system 70 may include a plurality of pitch drive mechanisms 32, i.e. one for each pitch axis 34. Further, as shown, each of the pitch drive mechanisms may be communicatively coupled to the power grid 45 and may also include one or more batteries 72. More specifically, as shown, each pitch drive mechanism 32 may be associated with a plurality of batteries 72 that are stored in a battery cabinet 74. Thus, in certain embodiments, the battery cabinets 74 may be thermally isolated containers. Moreover, as mentioned, the pitch system 70 may be controlled via the pitch controller 30. In addition, the pitch system 70 (and specifically the pitch controller and/or the turbine controller 26) may be communicatively coupled to the analytics server 76.

During normal operation of the wind turbine 10, the pitch drive motors 33 are driven by the power grid 45. However, in some instances, such as during an adverse grid event or grid loss, the pitch drive motors 33 may be driven by the batteries 72. If pitching of the rotor blades 22 relies on such batteries 72 (i.e. due to a grid loss), it is important to ensure that the batteries 72 are capable of operating when needed. Thus, the turbine controller 26 (or pitch controller 30) is configured to implement a control strategy for detecting fault in the batteries 72 so as to prevent damaging loads from occurring during an adverse grid event of a wind turbine 10 or any other scenarios where battery power is used to pitch the rotor blades 22.

Figure 5:
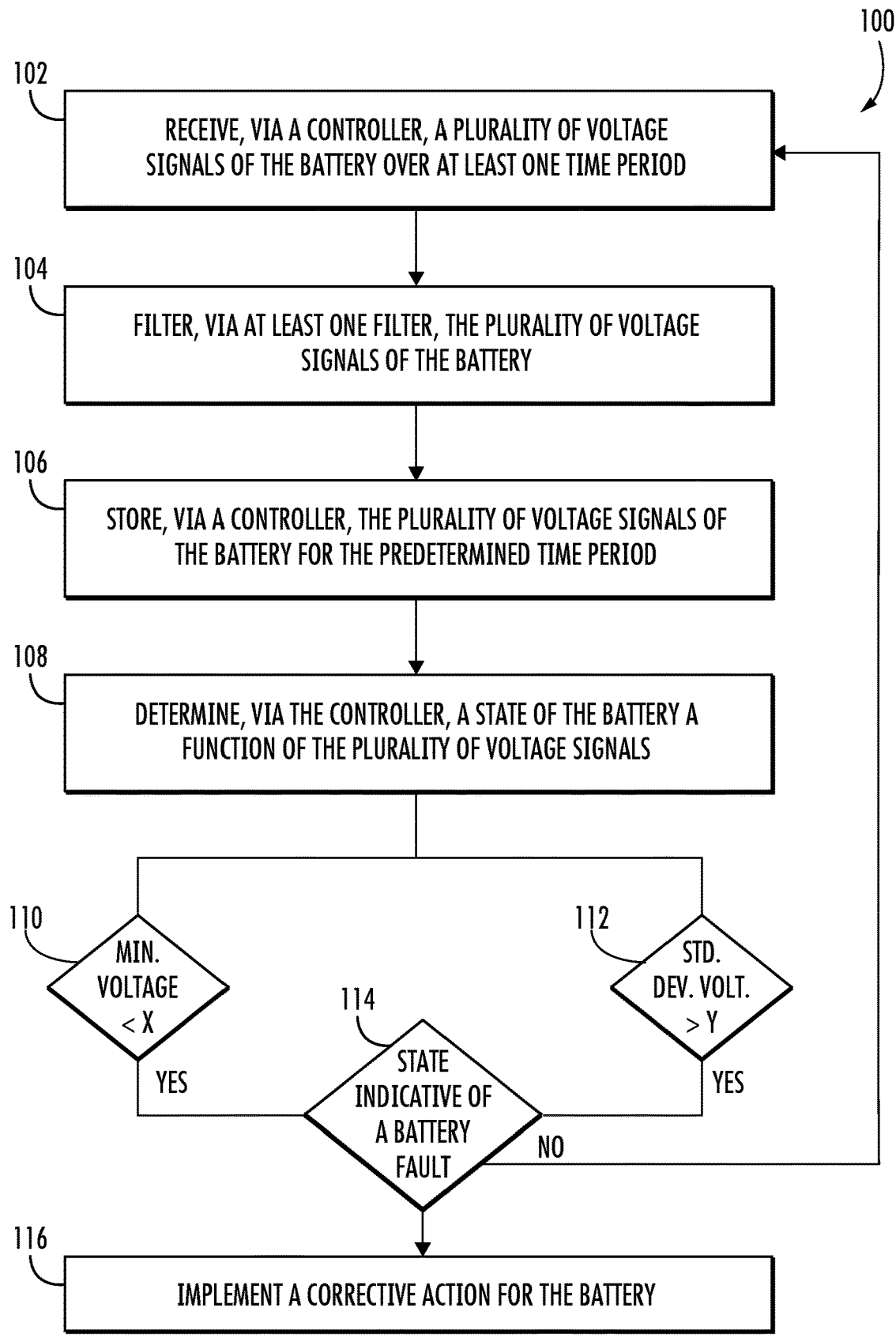
FIG. 5 illustrates a flow diagram of one embodiment of a method for detecting a fault in a direct current (DC) battery according to the present disclosure.

More specifically, as shown in FIG. 5, a flow diagram of one embodiment of a method 100 for detecting a fault in a direct current (DC) battery (such as one of the batteries 72) is illustrated. The method 100 may be implemented using, for instance, the turbine controller 26, the pitch controller 30, or the server 76 or combinations thereof discussed above with references to FIGS. 1-4. FIG. 5 depicts steps performed in a particular order for purposes of illustration and discussion. Those of ordinary skill in the art, using the disclosures provided herein, will understand that various steps of the method 100, or any of the methods disclosed herein, may be adapted, modified, rearranged, performed simultaneously, or modified in various ways without deviating from the scope of the present disclosure.

As shown at (102), the method 100 includes receiving (e.g. via one of the controller(s) 26, 30) a plurality of voltage signals of the battery 72 over at least one time period. For example, in an embodiment, the voltage signals may include a plurality of voltage signals, including for example, one or more minimum voltages, one or more maximum voltages, and/or one or more standard deviation values of the voltage. As such, in an embodiment, the turbine controller 26 is configured to send aggregated data of the voltage signals to the database 78 through a SCADA system (not shown) for additional processing.

In addition, in an embodiment, the method 100 may be implemented over multiple time periods. For example, the plurality of time periods may include 10-minute data aggregation intervals. Further, in particular embodiments, the time period(s) may occur when the battery is used to power a pitch motor of the pitch system 70. Thus, in certain embodiments, the method 100 may include monitoring, via at least one sensor (e.g. one of the pitch sensors 59), voltage of the battery 72 over the predetermined time period.

Referring still to FIG. 5, as shown at (104), in an embodiment, the method 100 may also include filtering, via at least one filter, the plurality of voltage signals of the battery 72. In such embodiments, the filter may include a low-pass filter, a high-pass filter, a band-pass filter, or combinations thereof. Thus, such filtering is configured to filter out flawed samples and high regeneration current.

Referring still to FIG. 5, as shown at (106), the method 100 may include storing the plurality of voltage signals of the battery 72 for the predetermined time period. For example, in an embodiment, the received voltage signals may be stored in a database 78 of the server 76 for further processing.

As shown at (108), the method 100 includes determining (e.g. via the server 76) a state of the battery 72 as a function of the plurality of voltage signals. As described herein, the state of the battery 72 generally refers to the overall health of the battery 72 and can be used by the server 76 schedule maintenance actions before the battery 72 (or batteries) fail. Accordingly, in certain embodiments, the server 76 is configured to determine the state of the battery 72 as a function of the received voltage signals, e.g. by comparing the minimum voltage(s) of the collected data to a minimum voltage threshold of the battery 72. In alternative embodiments, rather than comparing to a constant threshold, the received voltage signals from the battery 72 may be compared to batteries in other wind turbines and/or other batteries within the same wind turbine. Any outliers from this comparison could be identified as failing batteries. This could potentially be useful in correcting for environment factors (e.g. extreme heat/cold) because only detecting outliers from batteries within close proximity would filter out geographic/environment factors. Further, as shown at (110), when the minimum voltage(s) is below the minimum voltage threshold of the battery 72, the server 76 is configured to identify a voltage drop of the battery 72.

In additional embodiments, when the minimum voltage(s) of the collected data is below the minimum voltage threshold of the battery 72, as shown at (112), the server 76 may also be configured to determine at least one standard deviation value of the voltage signals of the battery 72 and compare the standard deviation(s) of the voltage signals to a predefined threshold. For example, in an embodiment, the controller(s) 26, 30 is configured to send ten-minute samples of battery voltage to the analytics server/processor. The samples may include a computed average, maximum voltage, minimum voltage, and/or the standard deviation for the ten-minute sample.

Therefore, the present disclosure is configured to use the minimum voltage to determine that a battery voltage is below normal value and the standard deviation to detect that it was a sustained drop. The server 76 can then also monitor for multiple occurrences of voltage drops to provide accurate failed battery detection, e.g. by counting the number of voltage drops that occurs over one or more time periods. For example, in an embodiment, the server 76 may log and store battery tests within, e.g. the last year and analyze such filtered samples, i.e. when the battery 72 is under load. In one embodiment, the processor may look for multiple occurrences of voltage drops, e.g. at least 30% of the last 10 tests to be faulted. The server 76 may also check that a fault occurred within, e.g. the last five tests to better filter out cases where a battery was replaced.

In particular embodiments, the analytics of the server 76 can be split into at least two scripts, the first being the battery voltage test history and the second being the battery voltage analytics. The table update script creates an archive of all pitch battery test records and the associated battery voltages (e.g. the minimum voltage, the maximum voltage, and the standard deviation) for wind turbines within a certain time period, such as the last year. The second script uses the data in the staging table to identify failing batteries. Therefore, by using only records when a battery test is occurring, the server 76 can ensure that the pitch batteries are under load. Further, in certain embodiments, the historical archive provides a quick look-up for wind turbines that infrequently perform battery tests.

As shown at (114), the method 100 may include determining whether the battery state is indicative of a battery fault. If so (e.g. based on the minimum voltage(s) being below the minimum voltage threshold and/or the standard deviation being above the predefined threshold), as shown at (116), the method 100 may include implementing a corrective action for the battery 72. For example, in one embodiment, the corrective action may include generating an alarm signal, scheduling a maintenance action for the battery 72, or replacing the battery 72. More specifically, in an embodiment, the method 100 may include replacing the battery 72 when multiple battery faults are detected in the battery 72.

Various aspects and embodiments of the present invention are defined by the following numbered clauses:

Clause 1. A method for detecting a fault in a direct current (DC) battery, the method comprising:

receiving, via a server, a plurality of voltage signals of the battery over at least one time period;

storing, via a database of a server, the plurality of voltage signals of the battery for the predetermined time period;

determining, via the server, a state of the battery as a function of the plurality of voltage signals; and, implementing a corrective action for the battery when the state of the battery is indicative of a battery fault.

Clause 2. The method of clause 1, wherein the plurality of voltage signals comprise one or more minimum voltage values, one or more maximum voltage signals, and/or one or more standard deviation values of a plurality of voltage signals.

Clause 3. The method of clause 2, further comprising filtering, via at least one filter, the plurality of voltage signals of the battery.

Clause 4. The method of clause 2, wherein determining the state of the battery as a function of the plurality of voltage signals further comprises:

comparing the one or more minimum voltage values to a minimum voltage threshold of the battery; and, when the one or more minimum voltage values are below the minimum voltage threshold of the battery, identifying a voltage drop of the battery.

Clause 5. The method of clause 4, wherein determining the state of the battery as a function of the plurality of voltage signals further comprises:

when the one or more minimum voltage values are below the minimum voltage threshold of the battery, determining, via a controller communicatively coupled to the server, one or more standard deviation values of the plurality of voltage signals of the battery; and, comparing, via the server, the one or more standard deviation values of the plurality of voltage signals to a predefined threshold to ensure that the voltage drop of the battery is sustained for a predetermined time period.

Clause 6. The method of any of the preceding claims, wherein the at least one time period comprises a plurality of time periods.

Clause 7. The method of clause 6, wherein the plurality of time periods comprise 10-minute data aggregation intervals.

Clause 8. The method of any of the preceding claims, further comprising monitoring, via at least one sensor, the plurality of voltage signals of the battery.

Clause 9. The method of any of the preceding claims, wherein the battery is part of a pitch system of a wind turbine.

Clause 10. The method of clause 9, wherein the at least one time period occurs when the battery is used to power a pitch motor of the pitch system.

Clause 11. The method of any of the preceding claims, wherein implementing the corrective action further comprises at least one of generating an alarm signal, scheduling a maintenance action for the battery, or replacing the battery.

Clause 12. The method of clause 11, further comprising replacing the battery when multiple battery faults are detected in the battery.

Clause 13. A system for detecting a fault in a battery of a pitch system of a wind turbine, the system comprising:

at least one sensor configured for monitoring a plurality of voltage signals of the battery over at least one time period;

a server communicatively coupled to the at least one sensor, wherein the server is configured to perform a plurality of operations, the plurality of operations comprising:

determining a state of the battery as a function of the plurality of voltage signals; and, implementing a corrective action for the battery when the state of the battery is indicative of a battery fault.

Clause 14. The system of clause 13, wherein the plurality of voltage signals comprises a minimum voltage, a maximum voltage, and/or one or more standard deviation values of a plurality of voltage signals.

Clause 15. The system of clause 14, further comprising at least one filter for filtering the plurality of voltage signals of the battery.

Clause 16. The system of clause 14, wherein determining the state of the battery as a function of the plurality of voltage signals further comprises: comparing the minimum voltage to a minimum voltage threshold of the battery; and, when the minimum voltage is below the minimum voltage threshold of the battery, identifying a voltage drop of the battery.

Clause 17. The system of clause 16, wherein determining the state of the battery as a function of the plurality of voltage signals further comprises:

when the minimum voltage is below the minimum voltage threshold of the battery, determining, via a controller communicatively coupled to the server, one or more standard deviations of the plurality of voltage signals of the battery; and, comparing the one or more standard deviation values of the plurality of voltage signals to a predefined threshold to ensure that the voltage drop of the battery is sustained for a predetermined time period.

Clause 18. The system of clauses 13-17, wherein the at least one time period comprises 10-minute data aggregation intervals.

Clause 19. The system of clauses 13-18, wherein the at least one time period occurs when the battery is used to power a pitch motor of the pitch system.

Clause 20. The system of clauses 13-19, wherein implementing the corrective action further comprises at least one of generating an alarm signal, scheduling a maintenance action for the battery, or replacing the battery.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for detecting a fault in a direct current (DC) battery, the method comprising:

receiving, via a server, a plurality of voltage signals of the battery over at least one time period, wherein the plurality of voltage signals comprise at least one of: one or more minimum voltage values, one or more maximum voltage signals, and one or more standard deviation values of a plurality of voltage signals;

storing, via a database of a server, the plurality of voltage signals of the battery for a predetermined time period;

determining, via the server, a state of the battery as a function of the plurality of voltage signals, wherein determining the state of the battery as a function of the plurality of voltage signals further comprises:

comparing the one or more minimum voltage values to a minimum voltage threshold of the battery; and, when the one or more minimum voltage values are below the minimum voltage threshold of the battery:

identifying a voltage drop of the battery;
determining, via a controller communicatively coupled to the server, the one or more standard deviation values of the plurality of voltage signals of the battery; and,
comparing, via the server, the one or more standard deviation values of the plurality of voltage signals to a predefined threshold to ensure that the voltage drop of the battery is sustained for the predetermined time period; and,
implementing a corrective action for the battery when the state of the battery is indicative of a battery fault.

2. The method of claim 1, further comprising filtering, via at least one filter, the plurality of voltage signals of the battery.

3. The method of claim 1, wherein the at least one time period comprises a plurality of time periods.

4. The method of claim 3, wherein the plurality of time periods comprise 10-minute data aggregation intervals.

5. The method of claim 1, further comprising monitoring, via at least one sensor, the plurality of voltage signals of the battery.

6. The method of claim 1, wherein the battery is part of a pitch system of a wind turbine.

7. The method of claim 6, wherein the at least one time period occurs when the battery is used to power a pitch motor of the pitch system.

8. The method of claim 1, wherein implementing the corrective action further comprises at least one of generating an alarm signal, scheduling a maintenance action for the battery, or replacing the battery.

9. The method of claim 8, further comprising replacing the battery when multiple battery faults are detected in the battery.

10. A system for detecting a fault in a battery of a pitch system of a wind turbine, the system comprising:
at least one sensor configured for monitoring a plurality of voltage signals of the battery over at least one time period, wherein the plurality of voltage signals comprise at least one of:
one or more minimum voltage values, one or more maximum voltage signals, and one or more standard deviation values of a plurality of voltage signals;
a server communicatively coupled to the at least one sensor, wherein the server is configured to store the plurality of voltage signals of the battery for a predetermined time period and perform a plurality of operations, the plurality of operations comprising:
determining a state of the battery as a function of the plurality of voltage signals, wherein determining the state of the battery as a function of the plurality of voltage signals further comprises;
comparing the one or more minimum voltage values to a minimum voltage threshold of the battery; and,
when the one or more minimum voltage values are below the minimum voltage threshold of the battery:
identifying a voltage drop of the battery;
determining, via a controller communicatively coupled to the server, the one or more standard deviation values of the plurality of voltage signals of the battery; and,
comparing, via the server, the one or more standard deviation values of the plurality of voltage signals to a predefined threshold to ensure that the voltage drop of the battery is sustained for the predetermined time period; and,
implementing a corrective action for the battery when the state of the battery is indicative of a battery fault.

11. The system of claim 10, further comprising at least one filter for filtering the plurality of voltage signals of the battery.

12. The system of claim 10, wherein the at least one time period comprises 10-minute data aggregation intervals.

13. The system of claim 10, wherein the at least one time period occurs when the battery is used to power a pitch motor of the pitch system.

14. The system of claim 10, wherein implementing the corrective action further comprises at least one of generating an alarm signal, scheduling a maintenance action for the battery, or replacing the battery.

* * * * *